(12) United States Patent
Martin et al.

(10) Patent No.: US 11,316,479 B1
(45) Date of Patent: Apr. 26, 2022

(54) LOAD INSENSITIVE POWER AMPLIFIER WITH QUADRATURE COMBINER

(71) Applicant: Cobham Advanced Electronic Solutions, Inc., Arlington, VA (US)

(72) Inventors: Daniel Martin, Harleysvillle, PA (US); Alan Haney, Schwenksville, PA (US); Chui Hong Park, Blue Bell, PA (US)

(73) Assignee: Cobham Advanced Electronic Solutions, Inc., Lansdale, PA (US)

( * ) Notice: Subject to any disclaimer, the term of this patent is extended or adjusted under 35 U.S.C. 154(b) by 0 days.

(21) Appl. No.: 17/063,588

(22) Filed: Oct. 5, 2020

(51) Int. Cl.
*H03F 1/30* (2006.01)
*H03F 3/24* (2006.01)
*H04B 1/04* (2006.01)
*H03F 1/04* (2006.01)

(52) U.S. Cl.
CPC .............. *H03F 1/30* (2013.01); *H03F 3/245* (2013.01); *H04B 1/04* (2013.01); *H03F 2200/447* (2013.01); *H03F 2200/451* (2013.01); *H04B 2001/045* (2013.01)

(58) Field of Classification Search
CPC ...... H03F 1/30; H03F 3/245; H03F 2200/447; H03F 2200/451; H04B 1/04; H04B 2001/045
USPC ............................................ 455/127.1–127.3
See application file for complete search history.

(56) References Cited

U.S. PATENT DOCUMENTS

| | | | |
|---|---|---|---|
| 2003/0085760 A1* | 5/2003 | Hirvilampi | H03F 3/211 330/124 R |
| 2012/0286866 A1 | 11/2012 | Khanifar et al. | |
| 2014/0292403 A1* | 10/2014 | Liu | H04L 27/368 330/149 |
| 2016/0049907 A1 | 2/2016 | Baker | |
| 2017/0302229 A1 | 10/2017 | Takayashiki et al. | |
| 2021/0027992 A1* | 1/2021 | Funk | H03F 1/56 |

OTHER PUBLICATIONS

Cobham Advanced Electronic Solutions, Inc., International Search Report and Written Opinion, PCT/US2021/053501, dated Jan. 25, 2022, 15 pgs.

* cited by examiner

*Primary Examiner* — Ankur Jain
(74) *Attorney, Agent, or Firm* — Morgan, Lewis & Bockius LLP

(57) ABSTRACT

This application is directed to methods and devices for an efficient power amplification system. An electronic device includes a first and a second power amplifier that are coupled to a quadrature combiner, a temperature monitoring circuit coupled to the first and second power amplifiers, and a controller coupled to the temperature monitoring circuit. The temperature monitoring circuit is configured to determine a temperature difference between the first and second power amplifiers. The controller is configured to adjust operation of at least one of the first and second power amplifiers to reduce the temperature difference between the first and second power amplifiers.

20 Claims, 11 Drawing Sheets

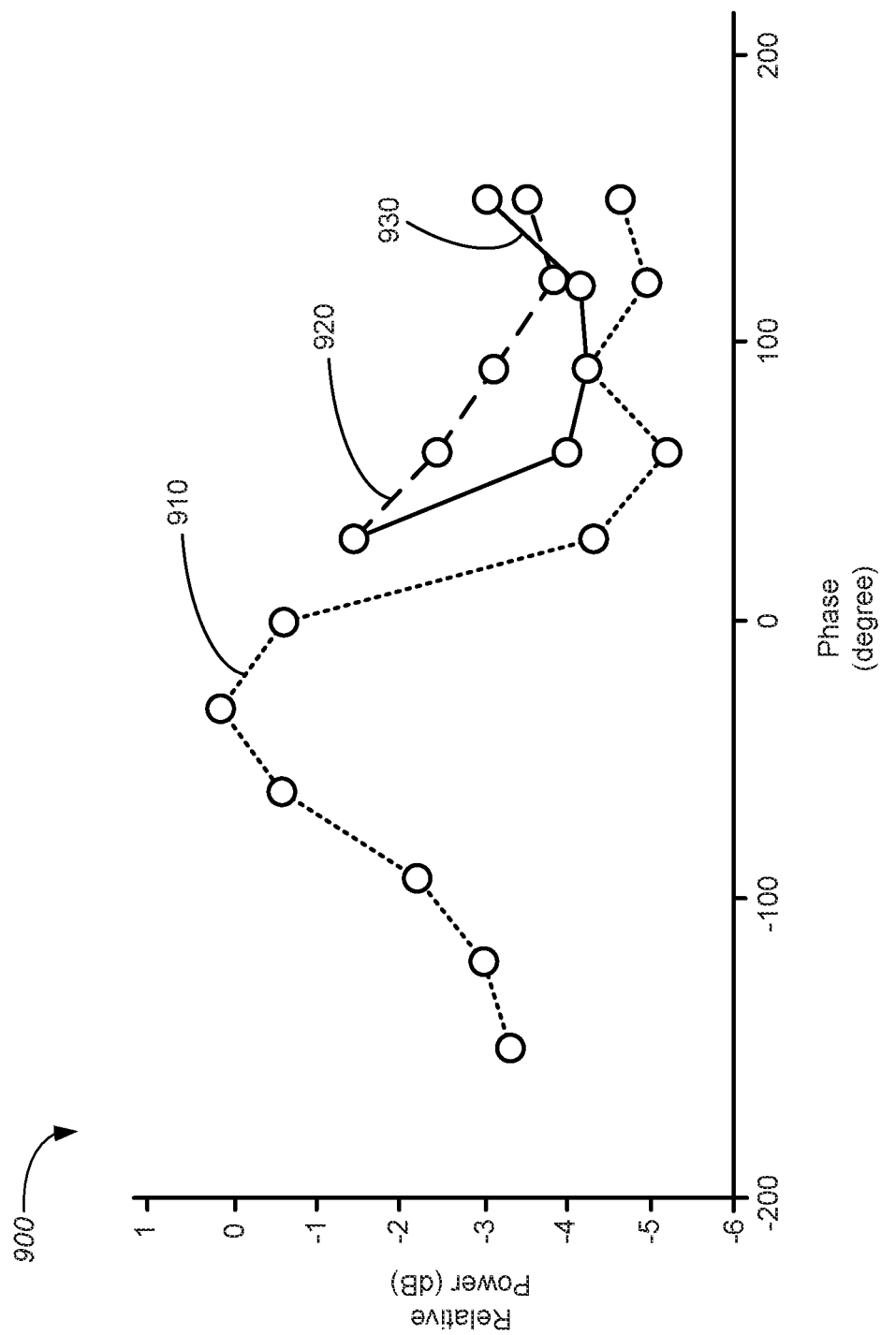

1000

1010 Determine a temperature difference between a first power amplifier and a second power amplifier. The first and second power amplifiers are coupled to a quadrature combiner.

1012 Measure a temperature of the first power amplifier.

1014 Measure a temperature of the second power amplifier.

1020 Compare the temperature difference to a predefined threshold value.

1030 Adjust operation of at least one of the first and second power amplifiers to reduce the temperature difference between the first and second power amplifiers.

1032 In accordance with a determination that the temperature difference is greater than a temperature difference tolerance, adjusting power from one of the first power amplifier and the second power amplifier includes one or more of:

(i) increasing an input power delivered to the first power amplifier,
(ii) increasing a bias current supplied to the first power amplifier,
(iii) increasing a bias voltage supplied to the first power amplifier,
(iv) decreasing a local environmental temperature of the first power amplifier,
(v) decreasing an input power delivered to the second power amplifier,
(vi) decreasing a bias current supplied to the second power amplifier,
(vii) decreasing a bias voltage supplied to the second power amplifier;
(viii) increasing a local environmental temperature of the second power amplifier

Figure 10

LOAD INSENSITIVE POWER AMPLIFIER WITH QUADRATURE COMBINER

TECHNICAL FIELD

The disclosed embodiments relate generally to power amplifiers, and in particular to methods and systems for improving efficiency of power amplifiers that are combined using a quadrature combiner.

BACKGROUND

Many electronic devices can communicate with other electronic devices wirelessly by transmitting and receiving radio frequency (RF) signals. Examples of these electronic devices include, but are not limited to, satellite systems, garage door openers, tablet computers, wireless speakers, and broadband network system. In these electronic devices, antennas are driven by power amplifiers that amplify RF signals to sufficiently high output power levels, thereby allowing the RF signals to be transmitted by the antennas in compliance with corresponding wireless communication protocols. Two power amplifiers are often combined with a two-way quadrature combiner to drive an antenna. The two-way quadrature combiner provides a 180° out-of-phase impedance between the two power amplifiers, and reduces a sensitivity of a combined output power level to a phase variation over an entire phase range of a voltage standing wave ratio (VSWR) load.

Despite improved power performance associated with the combined output power level, each of the two power amplifiers coupled by the quadrature combiner may still be sensitive to the VSWR load on the respective power amplifier. Unlike antennas in commercial telecommunication devices, which use isolators, broadband antennas cannot employ isolators across the entire bandwidth of operation. Additionally, as the broadband antennas are exposed to the environment (e.g., plane flying by, rain, wind), any physical change or signal interference related to the broadband antennas can change the VSWR load on each of the power amplifiers, thereby adversely affecting transmitting and receiving operation of the broad band antennas. For example, when multiple antennas are disposed and operate in proximity to one another, signals from these antennas interfere with one another and result in a high VSWR load with a random phase. Such as high VSWR load can cause the power amplifiers coupled to the antennas to output lower power levels compared with when the antennas are disposed apart from each other with little or no interference. Thus, it would be beneficial to provide a power amplification mechanism to increase the power output from power amplifiers that drive antennas under high VSWR load conditions.

SUMMARY

Various implementations of systems, methods and devices within the scope of the appended claims provide an efficient power amplification system, e.g., a power amplification system that includes two power amplifiers that are combined using a quadrature combiner. The power amplification system is configured to increase output power of the quadrature combiner under high VSWR load conditions. In some implementations, both amplifiers are operating near or at a safe operation limit (such as maximum safe operating temperature limit), thereby generating maximum or near maximum power allowed by the safe operation limit. In such cases, the quadrature combiner and the power amplification system outputs maximum or near maximum amount of power.

In some embodiments, an input signal of at least one of two power amplifiers is adjusted, such that both amplifiers are operating at or near a predetermined threshold temperature corresponding to the safe operation limit, thereby generating the maximum or near maximum amount of power within the safe operation limit. In some embodiments, the gain of at least one of the two power amplifiers is adjusted so that each of the two power amplifiers generates respective maximum or near maximum amount of power. Accordingly, when both of the power amplifiers generate the maximum or near maximum amount of power during high VSWR load conditions (which usually leads to a reduction in output power), the power amplification system has a relatively constant power output over different load VSWR phases. Such a power amplification system can provide a substantially constant power output, and be utilized in broadband systems that operate in a wide range of frequencies covering multiple decades (e.g., from 1 GHz to 10 GHz). This power amplification system can also be used for emergency wideband signals, jamming signals, or in VHF/UHF systems.

In one aspect, an electronic device includes a quadrature combiner, a first power amplifier coupled to the quadrature combiner, a second power amplifier coupled to the quadrature combiner, a temperature monitoring circuit coupled to the first and second power amplifiers, and a controller coupled to the temperature monitoring circuit. The temperature monitoring circuit is configured to determine a temperature difference between the first and second power amplifiers. The controller is configured to adjust operation of at least one of the first and second power amplifiers based on the determined temperature difference to reduce the temperature difference between the first and second power amplifiers.

In another aspect, a method is implemented by an electronic device that includes a temperature monitoring circuit and a controller coupled to the temperature monitoring circuit. The method includes determining, by the temperature monitoring circuit, a temperature difference between a first power amplifier and a second power amplifier. The first and second power amplifiers are each coupled to a quadrature combiner. The method further includes controlling, by the controller, operation of at least one of the first power amplifier and the second power amplifier based on the determined temperature difference in order to reduce the temperature difference between the first power amplifier and the second power amplifier.

The methods, systems, and non-transitory computer readable storage media herein address existing problems of reduced output power from a load sensitive power amplification system during high VSWR load conditions by controlling (e.g., adjusting) the temperature of the power amplifiers in order to increase the amount of power output from the power amplification system, thereby generating an even output power across multiple operational phases of the power amplification system.

BRIEF DESCRIPTION OF THE DRAWINGS

So that the present disclosure can be understood in greater detail, a more particular description may be found by reference to the features of various implementations, some of which are illustrated in the appended drawings. The appended drawings, however, merely illustrate the more pertinent features of the present disclosure and are therefore not to be considered limiting, for the description may admit to other effective features.

FIG. 9 is a graph illustrating relative power output from a power amplification system of an electronic device in accordance with some embodiments.

FIG. 10 illustrates a representative flow chart of a method for amplifying an RF signal in accordance with some embodiments.

Figure 1A:
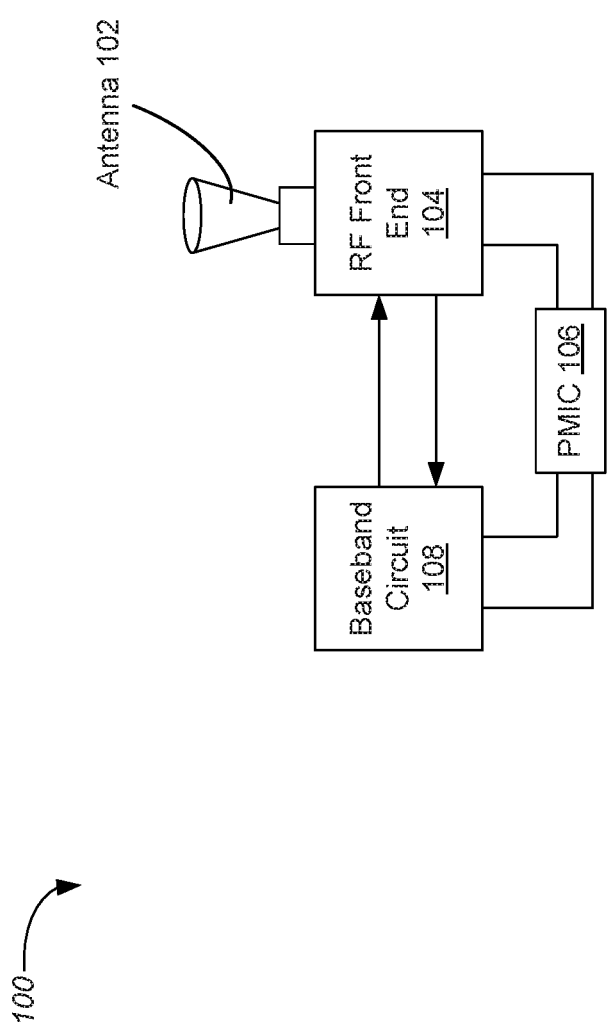
FIG. 1A illustrates a communication device configured to transmit and receive signals in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include methods and electronic devices for efficient power amplification. An electronic device includes a signal generator, a first power amplifier, a second power amplifier, and a quadrature combiner for driving one or more antennas of the electronic device. The signal generator includes a signal splitter (e.g., a splitter, a quadrature splitter), and is configured to provide a first signal to the first power amplifier and a second signal to the second power amplifier. The first and second amplifiers are configured to amplify the first and second signals, respectively. The quadrature combiner is configured to receive a power output from each of the first and second power amplifiers and output a combined power (e.g., a sum of the power output from each of the first and second power amplifiers) as an output power of the power amplification system.

The first and second power amplifiers provide output power in two distinct phases (e.g., that are 90 degrees apart) to its load, which may result in two different power amplification efficiencies between the two distinct phases. In some embodiments, the first and second signals transmitted to the first and second power amplifiers and have substantially equal powers (e.g., are balanced, the power of the first signal differs from the power of the second signal by less than a threshold power difference). Both of the first and second power amplifiers are working with their maximum or near maximum efficiencies. However, in some situations, the one or more antennas of the electronic device are physically damaged or experience signal interference. The signal generator may transmit the first and second signals to the first and second power amplifiers, respectively, at different powers, e.g., the power of the first signal differs from the power of the second signal by more than a threshold power difference. This causes the first and second power amplifiers to operate at different efficiencies. A difference in the efficiency of the first and second power amplifiers is reflected in a temperature difference between the first and second power amplifiers.

The temperature of a power amplifier is correlated to its efficiency, and a power amplifier that is operating more efficiently has a lower temperature compared to the same power amplifier that is operating less efficiently. In some embodiments, where power amplifiers of a power amplification system operate under the high VSWR load conditions, one of the two power amplifier operates at a higher temperature and is referred to as the low efficiency power amplifier, and the other one of the two power amplifiers operates at a lower temperature and is referred to as the high efficiency power amplifier. In some implementations, a combined power output from the quadrature combiner can be increased by balancing the temperature (e.g., reducing or minimizing a temperature difference) between the two power amplifiers, thereby balancing their efficiencies. The temperature difference between the first and second power amplifiers can be reduced or minimized by adjusting power of an input signal to at least one of the power amplifiers, a gain of one or both of the power amplifiers, and/or a local environmental temperature of one or both of the power amplifiers.

Specifically, the electronic device incorporates a temperature monitoring circuit to monitor a temperature difference between the two power amplifiers that are combined using the quadrature combiner. The electronic device also includes a controller configured to adjust operation of at least one of the two power amplifiers based on the determined temperature difference to reduce the temperature difference between the two power amplifiers (e.g., within a predefined temperature difference threshold). The operation of one of the two power amplifiers can be adjusted by enabling a power attenuator or booster to adjust the power of an input signal received at one of the two power amplifiers or by changing a gain of one of the two power amplifiers. In some embodiments, the temperature monitoring circuit includes a first temperature sensor, a second temperature sensor, and a comparison circuit. The first temperature sensor is configured to measure a temperature of the first power amplifier, and the second temperature sensor is configured to measure a temperature of the second power amplifier. The comparison circuit is configured to determine the temperature difference between the first and second power amplifiers based on the measured temperatures of the first and second power amplifiers. Alternatively, in some embodiments, the temperature monitoring circuit includes a temperature differential device configured to determine the temperature difference between the first power amplifier and the second power amplifier, e.g., directly and without measuring a temperature of each individual power amplifier.

FIG. 1A illustrates a communication device 100, in accordance with some embodiments. Communication device 100 is configured to transmit and receive radio frequency (RF) signals via an antenna 102 (which may represent an antenna array in some embodiments). The communication device 100 further includes at least an RF front end 104, a power management integrated circuit 106 (PMIC), and a baseband circuit 108. The antenna 102 is configured to convert electrical signals to electromagnetic waves and vice versa. In some embodiments, the antenna 102 transmits one or more electrical signals provided by the RF Frontend 104 as electromagnetic waves in space, e.g., when a cellular phone transmits a signal toward a satellite in order to place a call or determine a location of the cellular phone via a global positioning system. Conversely, in some embodiments, the antenna 102 receives one or more electromagnetic waves from the space and converts the electromagnetic waves to an RF electrical signal that can be processed by the RF Frontend 104, e.g., when a radio device receives radio waves and converts the radio waves into an electrical signal that is translated to music outputted from the radio device.

The RF front end 104 includes a plurality of RF components (such as amplifiers, filters, mixers, and digital/analog converters), and communicate with controllers (e.g., controller chipset, micro controller chipset) of the baseband circuit 108 via control and data lines. The controllers of the baseband circuit 108 generate low frequency signals that carry information to be transmitted by the antenna 102. However, the low frequency signals are not able to be transmitted over long distances, and thus, the low frequencies generated in the baseband circuit 108 are modulated with high carrier frequencies by the RF components in the RF front end 104 so that the information carried in the low frequencies can be transmitted over long distances via the antenna 102.

The PMIC 106 includes one or more components that generate power supplies and manages power usage of the communication device 100. The PMIC 106 implements one or more of: DC-to-DC voltage conversion, battery management, and power source selection. The PMIC 106 provides power supplies to both the baseband circuit 108 and the RF front end 104. Performance of the PMIC 106 is directly impacted by a power efficiency of the RF components in the RF front end 104 (e.g., power amplifiers 210 in FIG. 2).

Figure 1B:
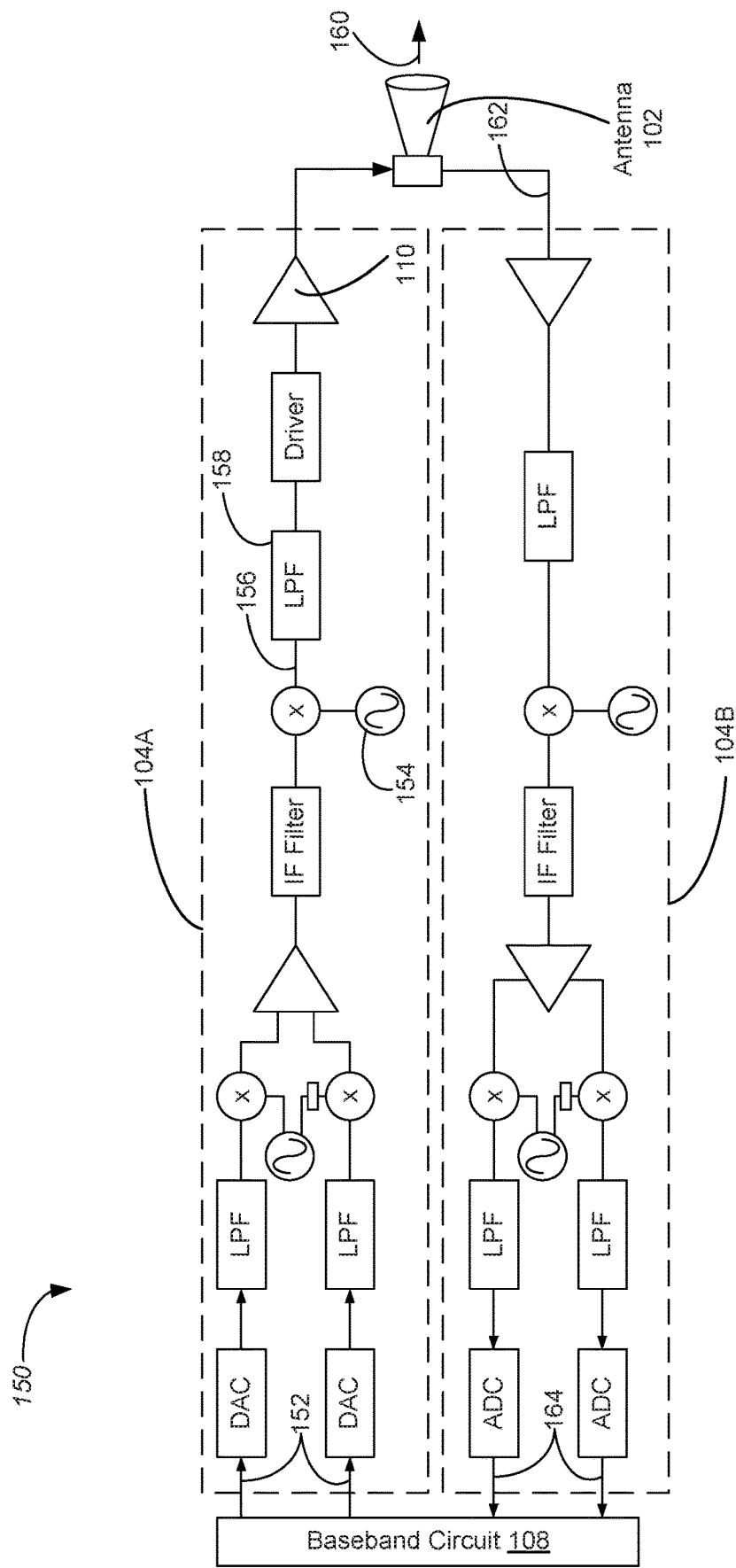
FIG. 1B is a block diagram of the communication device shown in FIG. 1A in accordance with some embodiments.

FIG. 1B is a block diagram 150 of the communication device 100 shown in FIG. 1A in accordance with some embodiments. The RF front end 104 includes a plurality of RF components, e.g., low pass filters (LPF), intermediate frequency (IF) filters, power amplifiers 110, oscillators, mixers, digital-to-analog converters (DAC), and analog-to-digital converters (ADC). In some embodiments, as shown, the RF front end 104 may be integrated as a front end chipset or package in a single chip. Alternatively, the RF front end 104 may be integrated across two or more chips.

The RF front end 104 includes an RF transmitter front end 104A and an RF receiver front end 104B. The RF transmitter front end 104A receives and preprocesses low frequency baseband signals 152 that carry digital data, mixes the preprocessed low frequency base band signal with a carrier signal 154 having a higher frequency than the baseband signals 152, and generates an RF signal 156. The RF signal 156 is further processed (e.g., filtered with a low pass filter 158 and amplified by a power amplifier 110) and fed to the antenna 102 to be broadcast thereby. Conversely, the RF receiver front end 104B demodulates RF signals 162 that are received at the antenna 102, extracts the low frequency components 164 from the received RF signals 162, and provides the low frequency components 164 to the baseband circuit 108.

The RF front end 104 utilizes a power amplification system 110 having one or more power amplifiers to increase the power of the RF signal 156 and ensure that the RF signal 160 transmitted from the antenna 102 has sufficient power to sustain a signal decay before the RF signal 160 reaches its destination. The power amplification system 110 is configured to provide substantially even (e.g., constant or near constant) output power across different phases of Load VSWR for the purposes of carrying sufficient power in the RF signal 160 to support transmission over the relatively long distance. For example, wireless systems with multiple antennas are fairly common, such as WiFi devices, cellphone towers, and signal jamming systems. The plurality of antennas can focus the RF energy (beam) to a designated receiver and therefore improve the communication signal quality. Interference between nearby antennas 102, such as when a signal from one antenna feeds into neighboring antenna(s), can cause a large VSWR load with a random phase, e.g., due to variation in the beam forming angle, frequency, and the distance between the antennas. In various embodiments of this application, the power amplification system 110 monitors a temperature difference of power amplifiers and adjust operations of at least one of its power amplifiers to compensate for any factors (e.g., signal interference from a nearby antenna) that increase the VSWR load and compromise the power output and/or efficiency of the power amplification system 110.

Figure 2:
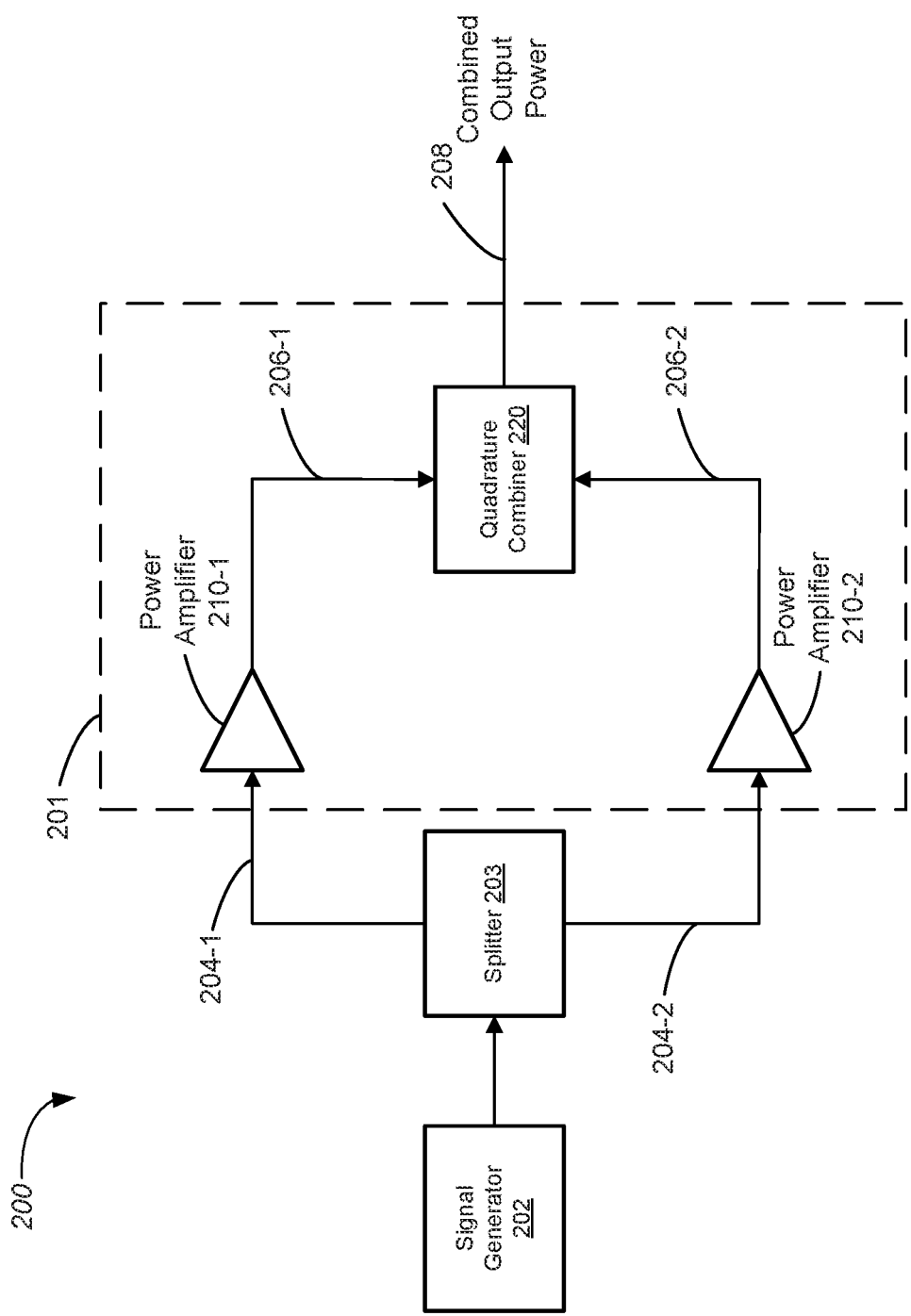
FIG. 2 is a block diagram of an example electronic device for amplifying signals in accordance with some embodiments.

FIG. 2 is a block diagram of an example electronic device 200 for amplifying signals in accordance with some embodiments. The electronic device 200 includes a power amplification system (corresponding to power amplification system 110) having two power amplifiers, 210-1 and 210-2 (also referred to collectively as power amplifiers 210), and a quadrature combiner 220. The power amplification system 201 is configured to receive input signals (e.g., RF signals), 204-1 and 204-2 (also referred to collectively as signals 204), and amplify the received signals 204 such that signals 208 outputted from the power amplification system (e.g., output from the quadrature combiner 220) carry a power greater than the signals 204 received by the power amplification system 201.

Specifically, in some embodiments, the electronic device 200 includes a signal generator 202 that has a signal splitter 203 configured to provide electrical signals 204-1 and electrical signals 204-2 to a first power amplifier 210-1 and a second power amplifier 210-2, respectively. Output signals 206-1 and 206-2 of the first and second power amplifiers 210-1 and 210-2 are combined using the quadrature combiner 220 (e.g., quadrature coupler) that is electrically coupled to each of the first and second power amplifiers 210-1 and 210-2. The combined signals 208 are provided to one or more components (such as an antenna 102) to be transmitted to another electronic device or to a power measurement component (such as a power sensor) to test performance of the electronic device 200.

In some situations, due to the randomness of the VSWR phase, it is possible for the first power amplifier 210-1 to operate more efficiently than the second power amplifier 210-2 (e.g., the first power amplifier 210-1 is the high-efficiency power amplifier and the second power amplifier 210-2 is the low-efficiency power amplifier) during a first VSWR phase. The role can then be reversed (e.g., the first power amplifier 210-1 is the low-efficiency amplifier and the second power amplifier 210-2 is the high-efficiency amplifier) in a second VSWR phase that is different from the first VSWR phase (e.g., the first VSWR phase and the second VSWR phase may have a phase difference of about 180 degrees). There are also some VSWR phases where both the first and second power amplifiers, 210-1 and 210-2, have a similar efficiency and are thus, operating optimally. In the VSWR phases where the first and second power amplifiers, 210-1 and 210-2, have a similar efficiency, the combined power output from the quadrature combiner 220 is usually high at or near a maximum amount of power that can be output.

The VSWR phase in which the power amplifiers 210 are operating can be determined based on a temperature difference between the first power amplifier 210-1 and the second power amplifier 210-2. The temperature of a power amplifier 210 is indicative of the efficiency of the power amplifier 210. Thus, a difference between the temperatures of the power amplifiers 210-1 and 210-2 indicates that the two power amplifiers, 210-1 and 210-2, are operating at different efficiencies, and thus, the combined power output from the quadrature combiner 220 is less than a target amount of power, e.g., less than the amount of combined power output from the quadrature combiner 220 when the two power amplifiers 210-1 and 210-2 are operating at similar efficiencies. In order to increase the combined power output from the quadrature combiner 220, the temperature difference between the power amplifiers, 210-1 and 210-2 are reduced to balance the temperatures of the two amplifiers 210-1 and 210-2.

In some embodiments, the amount of power delivered from each power amplifier 210 to the quadrature combiner 220 can be adjusted to increase (e.g., maximize) the combined power output from the quadrature combiner 220. Specifically, when the temperatures of the power amplifiers 210-1 and 210-2 are balanced (e.g., substantially similar such that a temperature difference between the power amplifiers 210-1 and 210-2 is less than a predetermined temperature difference threshold), the power amplifiers 210-1 and 210-2 collectively (e.g., in combination) provide more power to the quadrature combiner 220. In some situations, the first and second power amplifiers 210 are operating in two distinct phases. For example, the first power amplifier 210-1 is operating at a first efficiency during a first phase, and the second power amplifier 210-2 is operating at a second efficiency during the second phase. The second efficiency of the second amplifier 210-2 is higher than the first efficiency of the first amplifier 210-1, thereby causing a temperature difference between the first and second amplifiers 210.

In order to increase the combined power output from the quadrature combiner 220, the temperatures of the first and second power amplifiers, 210-1 and 210-2, are adjusted to reduce the temperature difference between the first and second power amplifiers 210-1 and 210-2. Specifically, the temperature difference between the two power amplifiers, 210-1 and 210-2, is reduced by any of: (1) increasing the power of the first input signal 204-1 received at the first power amplifier 210-1, (2) increasing a gain of the first power amplifier 210-1, (3) decreasing a local environmental temperature of the first power amplifier 210-1, e.g., by a local cooling component attached to the first power amplifier, (4) attenuating the power of the second input signal 204-2 received at the second power amplifier 210-2, (5) decreasing a gain of the second power amplifier 210-2, and/or (6) increasing a local environment temperature of the second power amplifier, e.g., using a heater physically attached to the second power amplifier. As a result, the temperatures of the power amplifiers 210 are more balanced, and therefore, the combined power output from the quadrature combiner 220 is increased.

The controller 270 is configured to adjust operation of at least one of the first and second power amplifiers 210 based on the temperature difference of the power amplifiers 210-1 and 210-2 such that total power received from the first and second power amplifiers 210-1 and 210-2 at the quadrature combiner 220 is increased and thus, the combined power output from the quadrature combiner 220 is also increased.

In some situations, the controller 270 is configured to adjust operation of at least one of the first and second power amplifiers 210 based on the temperature difference once at a start of each radio frequency transmission. Alternatively, in some embodiments, the controller 270 is configured to dynamically adjust operation (e.g., thereby adjusting a temperature) of at least one of the first and second power amplifiers 210 based on the temperature difference during each radio frequency transmission.

Figure 3:
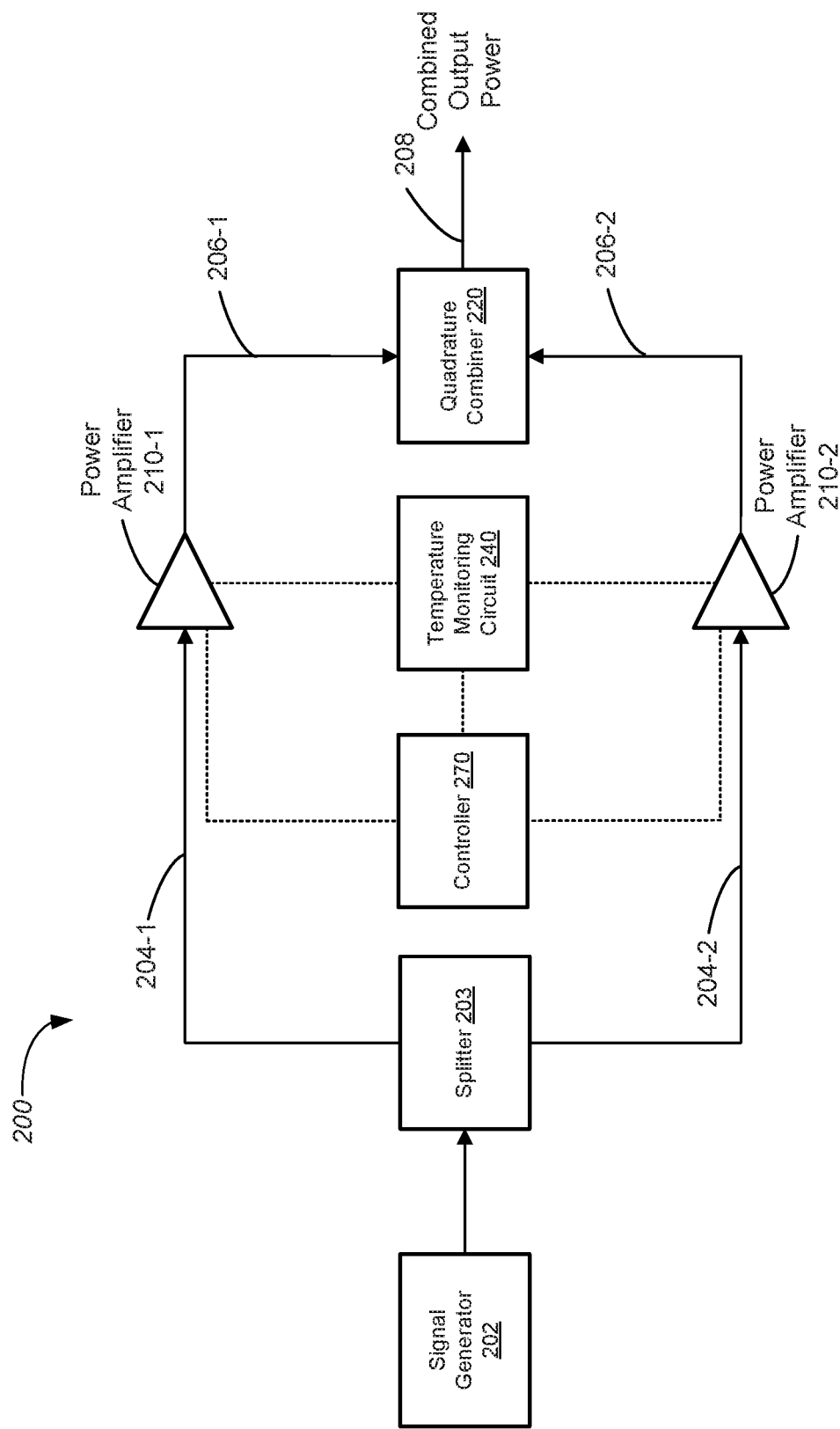
FIG. 3 is a block diagram of an example electronic device configured to control power amplifiers based on a temperature difference thereof, in accordance with some embodiments.

FIG. 3 is a block diagram of an example electronic device 200 configured to control power amplifiers 210 based on a temperature difference thereof, in accordance with some embodiments. In addition to a signal generator 202, a splitter 203, power amplifiers 210 and a quadrature combiner 220, the electronic device 200 further includes a temperature monitoring circuit 240 and a controller 270. The temperature monitoring circuit 240 is coupled to both of the first and second power amplifiers 210-1 and 210-2 and configured to measure a temperature difference between the first and second power amplifiers 210-1 and 210-2. Based on the temperature difference between the first and second power amplifiers 210-1 and 210-2, the electronic device 200 is configured to determine which one of the power amplifiers 210 is the more efficient amplifier (e.g., contributing more power than the other power amplifier), and which one of the power amplifiers 210 is the less efficient power amplifier (e.g., contributing less power than the other power amplifier). The controller 270 is coupled to the temperature monitoring circuit 240 and configured to control at least one of input powers, gains, and local environment temperatures of the power amplifiers 210.

The temperature difference between the first and second power amplifiers 210-1 and 210-2 is measured by the temperature monitoring circuit 240, and the first and second power amplifiers 210-1 and 210-2 are determined to be operating at different efficiencies when the temperature difference between the first and second power amplifiers 210-1 and 210-2 is determined to exceed a temperature difference tolerance (e.g., 5° C. or 10° C.) by the circuit 240 or the controller 270. For example, if the temperature difference is greater than the temperature difference tolerance, rebalancing the temperatures between the two amplifiers results in a higher combined output power 208 from the quadrature combiner 220.

Following the example where the first power amplifier 210-1 is operating less efficiently than the second power amplifier 210-2, the temperature between the two amplifiers, 210-1 and 210-2, can be re-balanced in a few different ways. In some embodiments, the temperature between the two amplifiers, 210-1 and 210-2, can be re-balanced by decreasing a temperature of the first power amplifier 210-1 in order to reduce a temperature difference between the two amplifiers, 210-1 and 210-2. An input power of the first input signal 204-1 received at the first power amplifier 210-1 can be increased (e.g., by a signal booster), a gain of the first power amplifier 210-1 can be increased, and/or a local environmental temperature of the first power amplifier 210-1 can be decreased (e.g., by an active cooling device such as an active heat sink or a fan) in order to balance the temperature between the first power amplifier 210-1 and the second power amplifier 210-2 (e.g., until the temperature difference is within the temperature difference tolerance). In some embodiments, the temperature between the two amplifiers, 210-1 and 210-2, can be re-balanced by increasing a temperature of the second power amplifier 210-2 in order to reduce a temperature difference between the two amplifiers, 210-1 and 210-2. An input power of the power of the second input signal 204-2 received at the second power amplifier 210-2 can be decreased (e.g., by an attenuator), and/or a gain of the second power amplifier 210-2 may be decreased to balance the temperature between the first power amplifier 210-1 and the second power amplifier 210-2 (e.g., until the temperature difference is within the temperature difference tolerance). It is noted that in this application, the temperature difference between the first and second power amplifiers, 210-1 and 210-2, is defined as equal to or greater than zero, while the temperature of the first power amplifier 210-1 is greater or less than the temperature of the second power amplifier 210-2.

Figure 4:
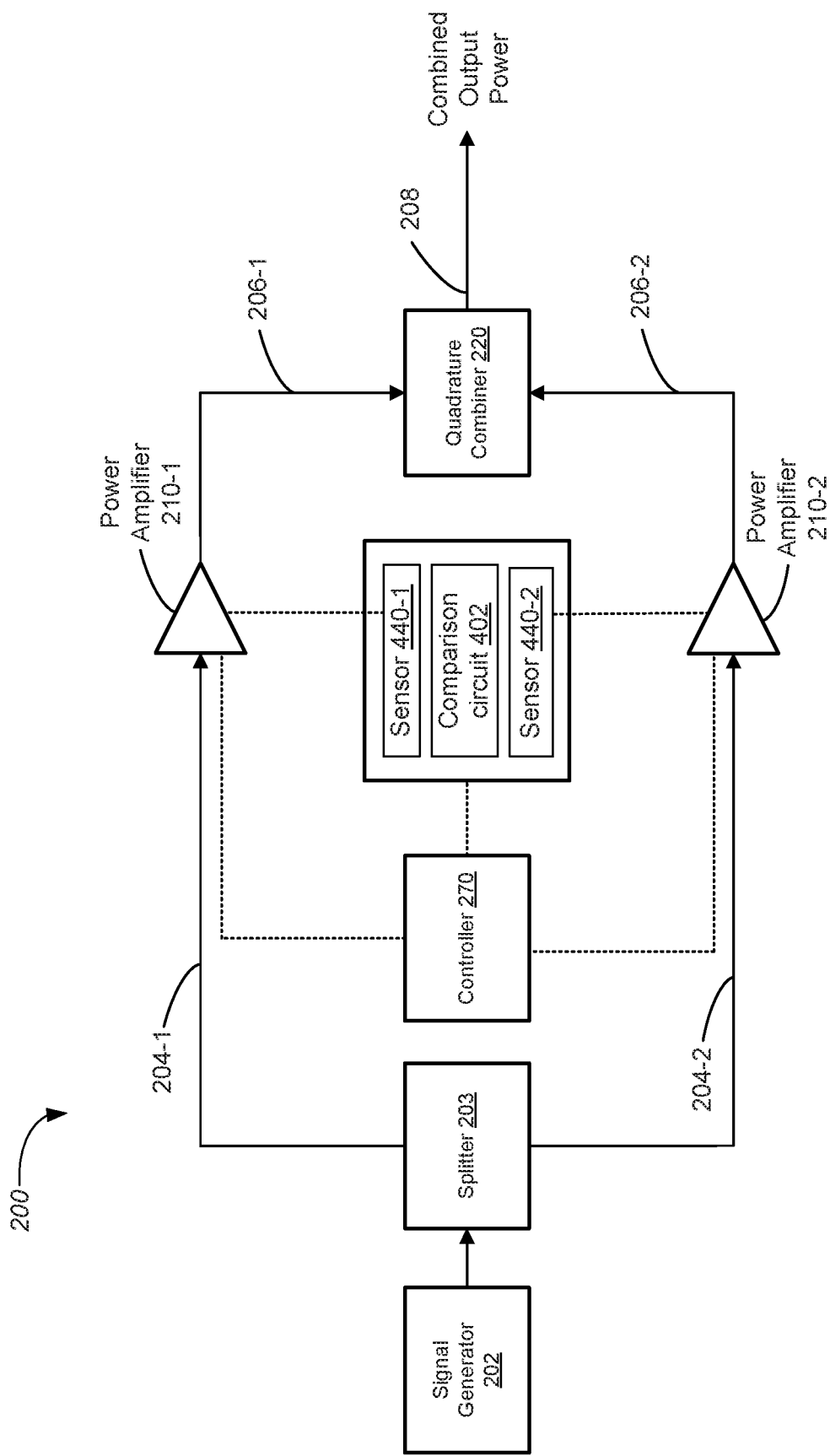
FIG. 4 is a block diagram of another example electronic device configured to control power amplifiers based on temperatures of the power amplifiers, in accordance with some embodiments.

FIG. 4 is a block diagram of an example electronic device 200 configured to control power amplifiers 210 based on temperatures of the power amplifiers 210, in accordance with some embodiments. Here, the electronic device 200 includes a signal generator 202, a splitter 203, power amplifiers 210, a quadrature combiner 220, a temperature monitoring circuit 240 and a controller 270. The temperature monitoring circuit 240 is configured to measure a temperature difference between the first and second power amplifiers 210-1 and 210-2, and the controller 270 is configured to control one or both of the power amplifiers 210.

Additionally, the temperature monitoring circuit 240 includes a first temperature sensor 440-1 thermally coupled to the first power amplifier 210-1 and a second temperature sensor 440-2 thermally coupled to the second power amplifier 210-2. The first temperature sensor 440-1 is configured to measure a temperature of the first power amplifier 210-1 and the second temperature sensor 440-2 is configured to measure a temperature of the second power amplifier 210-2. The temperature sensors 440 (e.g., thermometers) may be any type of temperature measuring device, such as a thermocouple or a thermistor, which can be applied to measure a temperature of the power amplifiers 210. The temperature monitoring circuit 240 further includes a comparison circuit 402 configured to determine (e.g., calculate) a temperature difference between the first and second power amplifiers 210-1 and 210-2 based on the temperatures measured by the temperature sensors 440-1 and 440-2.

In some embodiments not shown in FIG. 4, the temperature monitoring circuit 240 may include a temperature differential device that is configured to determine the temperature difference between the first power amplifier 210-1 and the second power amplifier 210-2 directly, i.e., without measuring the temperatures of the first and second amplifiers 210 separately and deriving the temperature difference using the separately measured temperatures. Examples of the temperature differential device include, but are not limited to, a thermoelectric generator (e.g., a Seebeck generator) that is configured to provide an electrical signal in response to a temperature difference between the first and second power amplifiers 210-1 and 210-2.

Referring to FIGS. 3 and 4, the temperature monitoring circuit 240 is used to determine the temperature difference of the power amplifiers 210. The controller 270 is configured to control an amount of power coupled from at least one of the first power amplifier 210-1 and the second power amplifier 210-2 to the quadrature combiner 220, e.g., by adjusting the gain of at least one of the first power amplifier 210-1 and the second power amplifier 210-2, based on the determined temperature difference and based on a determination of which power amplifier is the diligent amplifier and which power amplifier is the lazy amplifier.

In some situations, the temperature difference between the first power amplifier 210-1 and the second power amplifier 210-2 is greater than a temperature difference tolerance, and the first power amplifier 210-1 has a higher temperature than the second power amplifier 210-2. The controller is configured to adjust operation of at least one of the first power amplifier 210-1 or the second power amplifier 210-2 to adjust at least one of the temperature of the first power amplifier 210-1 and/or the temperature of the second power amplifier 210-2. The controller 270 decreases the temperature of the first power amplifier 210-1 by performing any of the following actions: increasing an input power of the first input signal 204-1 delivered to the first power amplifier 210-1, increasing a bias current supplied to the first power amplifier 210-1, increasing a bias voltage supplied to the first power amplifier 210-1, and decreasing a local environmental temperature of the first power amplifier 210-1. Alternative to or in conjunction with decreasing the temperature of the first power amplifier 210-1, the controller 270 increases a temperature of the second power amplifier 210-2 by performing any of the following actions: decreasing an input power of the second input signal 204-2 delivered to the second power amplifier 210-2, decreasing a bias current supplied to the second power amplifier 210-2, decreasing a bias voltage supplied to the second power amplifier 210-2, and increasing a local environmental temperature of the second power amplifier 210-2.

Figure 5:
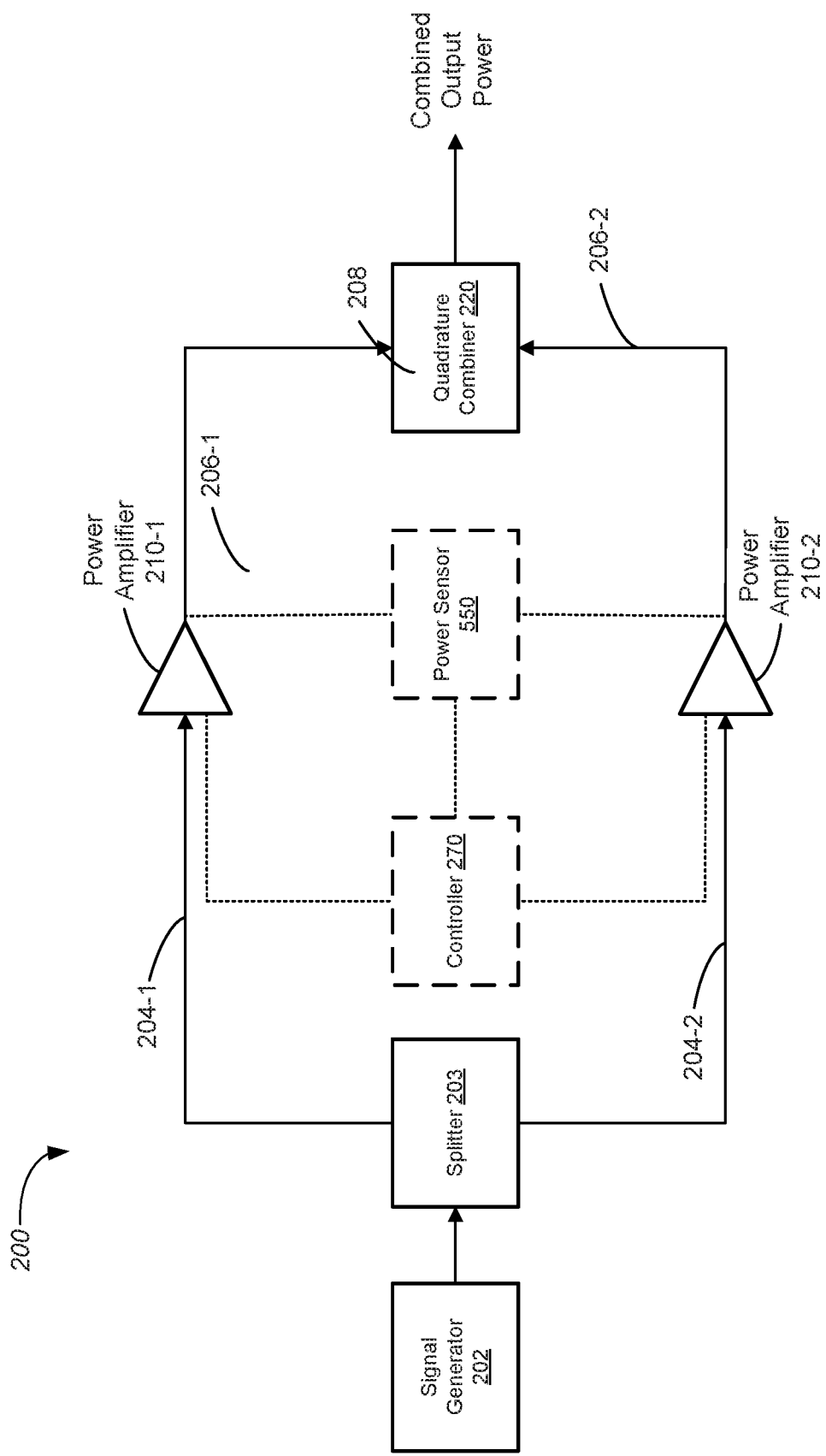
FIG. 5 is a block diagram of an example electronic device configured to control power amplifiers based on an output power difference of the power amplifiers, in accordance with some embodiments.

FIG. 5 is a block diagram of an example electronic device 200 configured to control power amplifiers 210 based on an output power difference of the power amplifiers 210, in accordance with some embodiments. The electronic device 200 includes a signal generator 202, a splitter 203, power amplifiers 210, and a quadrature combiner 220. Referring to FIG. 5, in some embodiments, the electronic device 200 further includes a power sensor 550 (such as an RF power sensor) configured to measure a difference in output powers from the first power amplifier 210-1 and the second power amplifier 210-2. A controller 270 is coupled to the power sensor 550 and configured to control (e.g., adjust) operation of the first power amplifier 210-1 and/or the second power amplifier 210-2 based on the output power difference of the first and second power amplifiers 210-1 and 210-2.

The output power difference of the first and second power amplifiers 210-1 and 210-2 is used to determine whether the power amplification system 201 is operating under high VSWR load conditions and if so, identify which power amplifier, between the power amplifiers 210, is operating more efficiently and which power amplifier is operating less efficiently. The temperature of at least one of the power amplifiers 210-1 or 210-2 can be controlled (e.g., adjusted) by the controller 270 in order to balance the temperatures between the power amplifiers 210-1 and 210-2, using the methods described above with respect to FIGS. 2-4, in order to increase the overall power (e.g., sum of the power output from the first and second power amplifiers 210, 206-1 and 206-2) delivered to the quadrature combiner 220.

Figure 6:
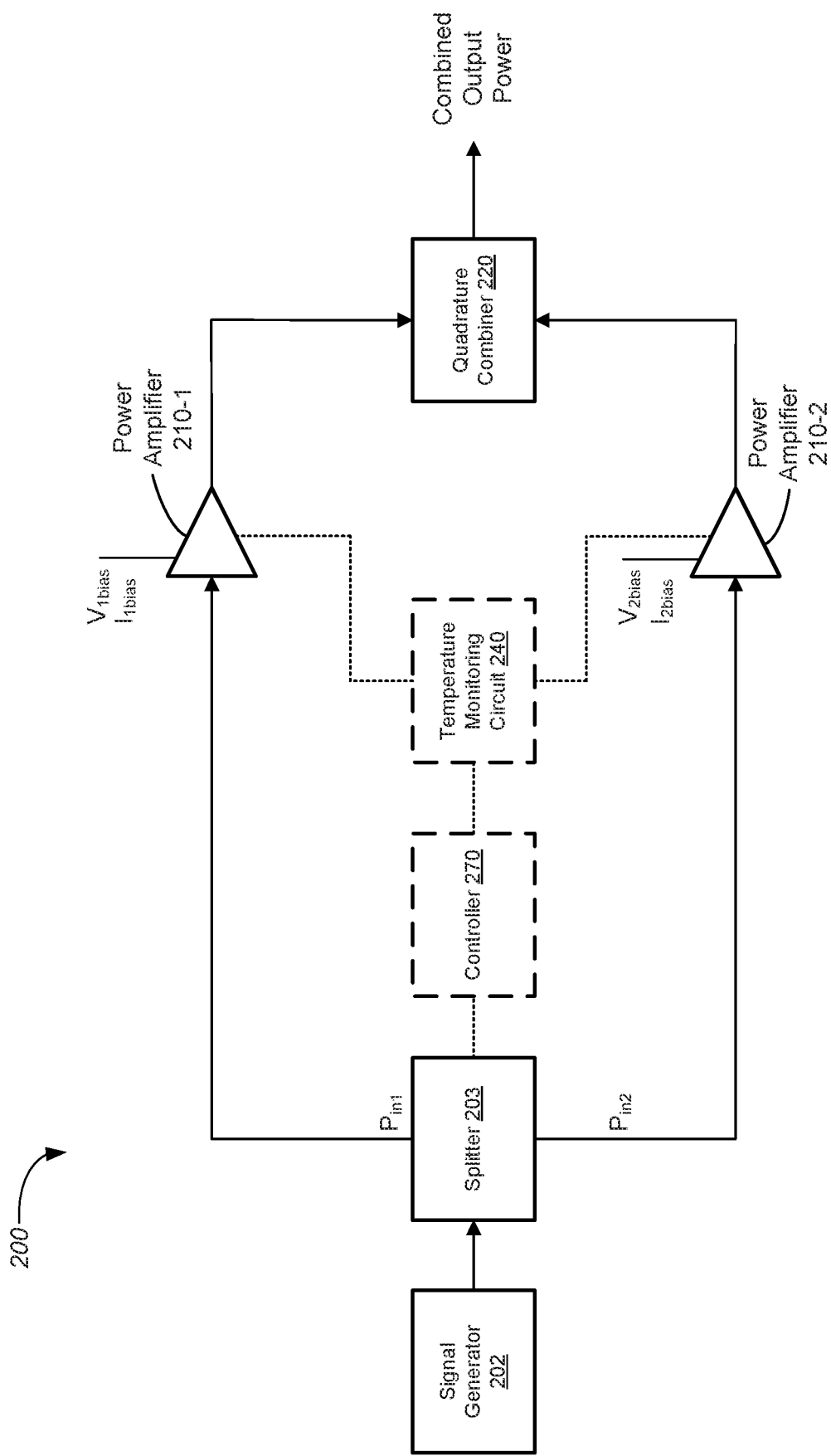
FIG. 6 is a block diagram of an example electronic device configured to control a gain or input power of power amplifiers based on a temperature difference of the power amplifiers, in accordance with some embodiments.

FIG. 6 is a block diagram of another example electronic device 200 configured to control a gain or input power of power amplifiers 210 based on a temperature difference of the power amplifiers 210, in accordance with some embodiments. A controller 270 is coupled to a temperature monitoring circuit 240 that is configured to measure the temperature difference of the power amplifiers 210. The controller 270 is configured to control a power output from at least one of the first and second power amplifiers 210-1 and 210-2 and coupled into the quadrature combiner 220 based on the temperature difference. Referring to FIG. 6, in some embodiments, the controller 270 is coupled to the splitter 202, and configured to control a bias current $I_{bias}$ and/or a reference voltage $V_{bias}$ (also called a bias voltage) provided to the power amplifiers 210. By these means, the gains of the power amplifiers 210 are adjusted to balance the temperatures between the power amplifiers 210, thereby increasing the total amount of power delivered by the quadrature combiner 220.

In some embodiments, the temperature difference between the power amplifiers 210-1 and 210-2 is greater than a temperature difference tolerance. The first power amplifier 210-1 has a higher temperature than the second power amplifier 210-2 (e.g., by more than the temperature difference tolerance). In some embodiments, the controller 270 only increases a first gain of the first power amplifier 210-1 by increasing a bias voltage ($V_{1bias}$) or a bias current ($I_{1bias}$) that is received at the first power amplifier 210-1 (e.g., from a reference generator not shown in FIG. 6). In some embodiments, the controller 270 only decreases a second gain of the second power amplifier 210-2 by decreasing a bias voltage ($V_{2bias}$) or a bias current ($I_{2bias}$) that is received at the second power amplifier 210-2 (e.g., from a reference generator not shown in FIG. 6). In some embodiments, the controller 270 concurrently increases the first gain of the first power amplifier 210-1 and decreases the second gain of the second power amplifier 210-2. When the bias voltage $V_{bias}$ or bias current $I_{bias}$ of one of the power amplifiers 210 is adjusted, an operational point of the one of the power amplifiers 210 is changed on a current-voltage (I-V) curve, so is the gain of the corresponding power amplifier 210.

Additionally, the controller 270 is configured to control an output of a splitter 203 coupled to the signal generator 202, i.e., input power $P_{in1}$ of the first input signal 204-1 and input power $P_{in2}$ of the second input signal 204-2. The power of the input signals 204-1 and 204-2 to the power amplifier 210-1 or 210-2 can be attenuated or increased. For example, while the temperature difference is determined to be greater than a predefined temperature difference tolerance, the first power amplifier 210-1 is determined to have a higher temperature than the second power amplifier 210-2, e.g., by more than the temperature difference tolerance. In accordance with a determination that the temperature difference between the first power amplifier 210-1 and the second power amplifier 210-2 is greater than the predefined temperature difference tolerance, the controller 270 increases (e.g., boosts) the input power $P_{in1}$ of the first input signal 204-1 transmitted to the power amplifier 210-1 or attenuates the input power $P_{in2}$ of the second input signal 204-2 transmitted to the second power amplifier 210-2. Conversely, in accordance with that the temperature difference is greater than the predefined temperature difference tolerance and that the first power amplifier 210-1 is determined to have a lower temperature than the second power amplifier 210-2, the controller 270 attenuates the input power $P_{in1}$ of the first input signal 204-1 transmitted to the first power amplifier 210-1 or increases the input power $P_{in2}$ of the second input signal 204-2 transmitted to the second power amplifier 210-2. In some embodiments, an attenuator is electrically coupled between the splitter 203 and a respective power amplifier 210, and enabled to attenuate the respective input power $P_{in1}$ or $P_{in2}$ of the respective input signal 204-1 or 204-2. In some embodiments, a power amplifier stage is electrically coupled between the splitter 203 and power amplifier 210, and enabled to increase the respective input power $P_{in1}$ or $P_{in2}$ of the input signal 204-1 or 204-2.

Figure 7:
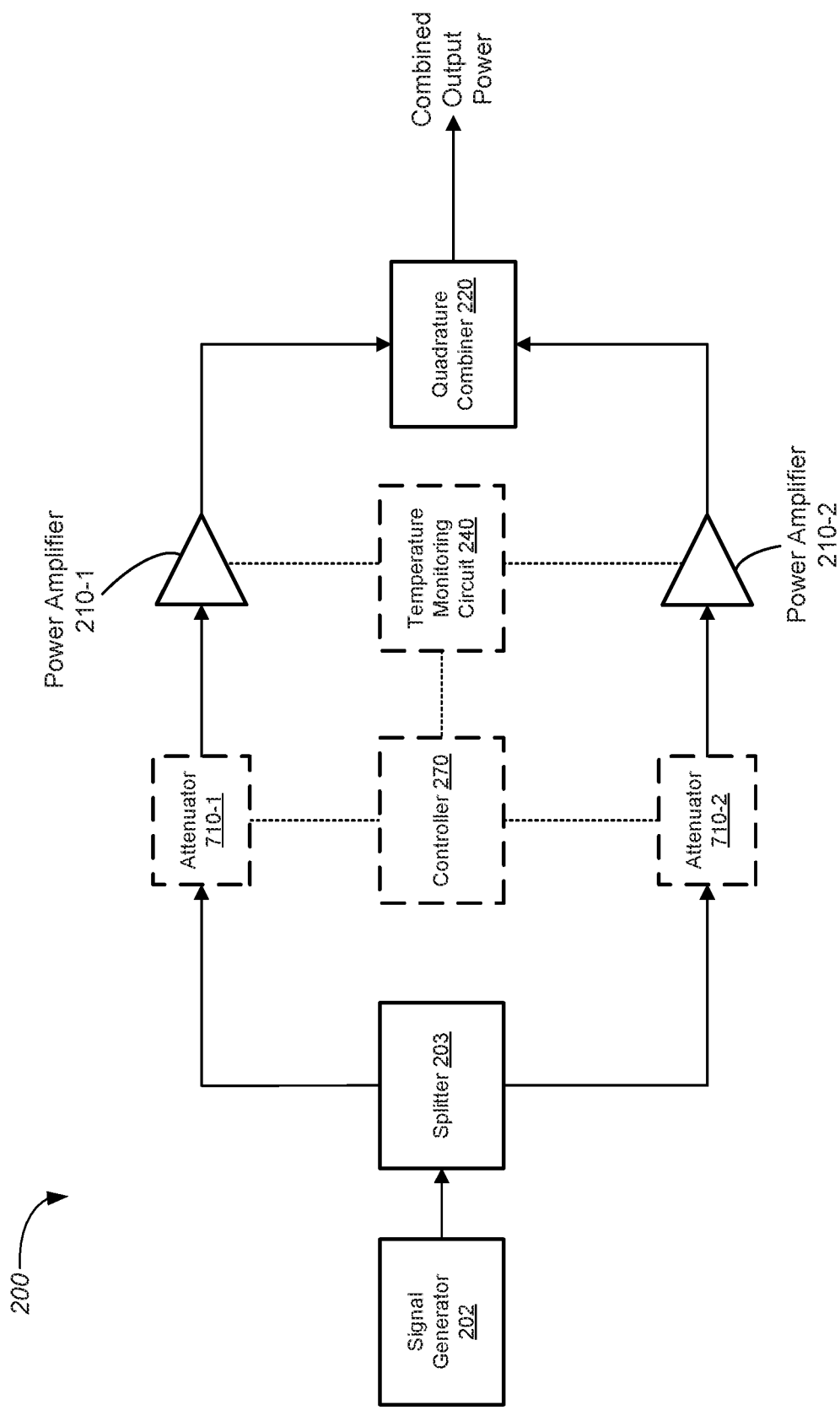
FIG. 7 is a block diagram of an example electronic device configured to control an output power of power amplifiers based on a temperature difference of the power amplifiers, in accordance with some embodiments.

FIG. 7 is a block diagram of an example electronic device 200 configured to control the input power of one or more of the power amplifiers 210 based on a temperature difference of the power amplifiers 210, in accordance with some embodiments. The electronic device 200 includes a first attenuator 710-1 configured to attenuate an input power of the first power amplifier 210-1 and a second attenuator 710-2 configured to attenuate an input power of the second power amplifier 210-2. Each of the attenuators 710 includes an attenuating component or attenuating circuit. In some embodiments, the attenuators 710-1 and 710-2 work independently from one another. Alternatively, in some embodiments, the operation of the first attenuator 710-1 is at least partially determined by the operation of the second attenuator 710-2, or vice versa.

In some embodiments, the controller 270 is coupled to the first attenuator 710-1 and the second attenuator 710-2 and configured to control the attenuators 710 based on the temperature difference determined by the temperature monitoring circuit 240. In some situations, it is determined that the temperature difference of the power amplifiers 210 is greater than a temperature difference tolerance and that the first power amplifier 210-1 has a higher temperature than the second power amplifier 210-2. The controller 270 enables the attenuator 710-1 to attenuate the input power of the first signal 204-1 such that the temperature of the first power amplifier 210-1 is reduced, thereby reducing a temperature difference between the first power amplifier 210-1 and the second power amplifier 210-2. Conversely, in some situations, it is determined that the temperature difference of the power amplifiers 210 is greater than the predefined temperature difference tolerance and that the first power amplifier 210-1 has a lower temperature than the second power amplifier 210-2. The controller 270 enables the attenuator 710-2 to attenuate the input power of the second signal 204-2 thereby reducing the temperature of the second power amplifier 210-2 and reducing the temperature difference between the first power amplifier 210-1 and the second power amplifier 210-2. It is noted that in some embodiments, the temperatures of the first and second power amplifiers 210 are substantially similar when a difference between the temperatures (with respect to its ambient temperature) is less than a predefined temperature difference threshold, such as a specific value or percentage (e.g., <10%).

Figure 8:
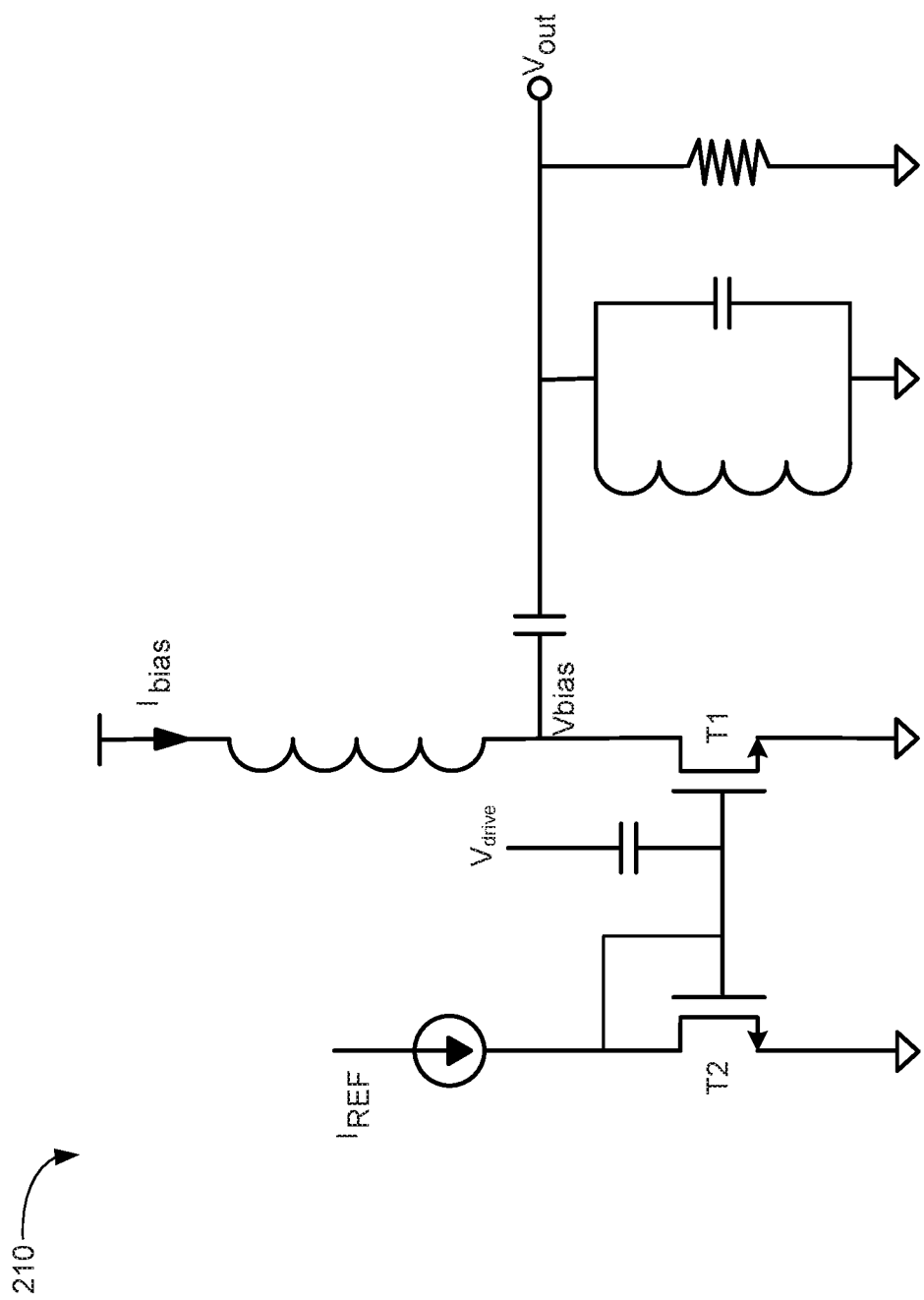
FIG. 8 is a circuit diagram of a power amplifier in accordance with some embodiments.

FIG. 8 is a circuit diagram of an example power amplifier 210 in accordance with some embodiments. The power amplifier 210 is configured to receive a driving voltage $V_{drive}$ and a reference current $I_{REF}$ and provides an output RF signal $V_{out}$. The driving voltage $V_{drive}$ includes an alternating current (AC) portion corresponding to an input RF signal to be amplified to the output RF signal $V_{out}$. A bias current $I_{bias}$ is determined by the reference current $I_{REF}$ based on current mirroring between transistors T1 and T2. In some embodiments, the bias current $I_{bias}$ is equal to the reference current $I_{REF}$. A drain of the transistor T1 has a bias voltage $V_{bias}$, and an RF gain of the power amplifier 210 are positively related to the bias voltage $V_{bias}$ and the bias current $I_{bias}$. In some embodiments, output RF signals of two power amplifiers 210 are combined using a quadrature combiner 220 to provide a larger amplification of the input RF signals. The bias current $I_{bias}$ or bias voltage $V_{bias}$ of a power amplifier is adjusted to balance the output RF signals (by balancing the temperatures of the power amplifiers) combined by a quadrature combiner 220 and provide a substantially even output powers between different phases of the load VSWR. In some embodiments, the output powers of the two power amplifiers 210 are substantially even when their temperature difference is less than a predefined temperature difference threshold (e.g., <10% difference).

The power amplifier 210 shown in FIG. 8 may correspond to any (or both) of power amplifiers 210-1 and 210-2 shown in FIGS. 2-7. In those embodiments described with reference to FIGS. 2-7, two power amplifiers 210 are coupled to a quadrature combiner 220. The gain of each of the power amplifiers 210 may be adjusted (e.g., increased or decreased) based on a determined temperature difference between temperatures of the two power amplifiers 210 coupled to the quadrature combiner 220. For example, one of the power amplifiers 210 coupled to the quadrature combiner 220 has a higher temperature than the other power amplifier 210 and is determined to be the less efficient amplifier among the two power amplifiers 210. The gain of the less efficient amplifier 210 is increased by increased the bias current $I_{bias}$ (therefore increased in a gate voltage Vg of the transistor T1) and/or the bias voltage $V_{bias}$. Conversely, in some embodiments, one of the power amplifiers 210 coupled to the quadrature combiner 220 has a lower temperature than the other power amplifier 210 and is determined to be the more efficient amplifier among the two power amplifiers 210. The gain of the more efficient amplifier is decreased by decreasing the bias current $I_{bias}$ (therefore decreasing in a gate voltage Vg of the transistor T1) and/or the bias voltage $V_{bias}$. In some embodiments, the power amplifier includes one or more biasing components, such as a biasing diode or biasing resistors (e.g., potentiometer). In such cases, the bias voltage $V_{bias}$ is adjusted (e.g., increased or decreased) via the biasing diodes or biasing resistors.

FIG. 9 is a graph 900 illustrating relative power output from a power amplification system of an electronic device 200 in accordance with some embodiments. The power amplification system includes two power amplifiers 210-1 and 210-2 coupled to a quadrature combiner 220. The two power amplifiers 210-1 and 210-2 correspond to two operational phases that are cycled through the phase of the VSWR load (−180 to +180 degree). The short dashed line 910 illustrates the relative combined power output from the quadrature combiner 220 when the two power amplifiers are operating in a phase under high VSWR load and the temperatures of the power amplifiers 210 are unbalanced. Dashed line 920 and solid line 930 illustrate the relative combined power output from the quadrature combiner 220 when the temperatures of the power amplifiers 210 are balanced by one of the methods described above with respect to FIGS. 2-4. As shown, a significant improvement (e.g., increase) in the combined output power from the quadrature combiner 220 is achieved by the balancing the temperatures of the power amplifiers 210.

FIG. 10 illustrates a representative flow chart of a method 1000 for amplifying an RF signal in accordance with some embodiments. The method 1000 includes determining (1010) a temperature difference between a first power amplifier 210-1 and a second power amplifier 210-2. The first and second power amplifiers 210-1 and 210-2 are coupled to a quadrature combiner 220. The method 1000 also includes adjusting (1030) power from one of the first and second power amplifiers 210 based on the determined temperature difference such that signals received from the first and second power amplifiers 210-1 and 210-2 at the quadrature combiner 220 are similar to one another. In some embodiments, the quadrature combiner 220 is coupled to an antenna array 102 configured to transmit a radio frequency signal 160 generated by the quadrature combiner. The antenna array corresponds to a voltage standing wave ratio (VSWR) load, and the temperature difference between the first and second power amplifiers is associated with the VSWR load. The power from the one of the first and second power amplifiers 210 may be adjusted based on the determined temperature difference at a start of each radio frequency transmission or dynamically during each radio frequency transmission.

In some embodiments, the one of the first and second power amplifiers includes the first power amplifier 210-1, and the power delivered from the second power amplifier 210-2 to the quadrature combiner 220 is not adjusted (e.g., not changed). In some embodiments, the power delivered from the second power amplifier 210-2 to the quadrature combiner 220 is increased concurrently with the power delivered from the first power amplifier 210-1 to the quadrature combiner 220 being decreased.

In some embodiments, the method 1000 also includes measuring (1012) a temperature of the first power amplifier 210-1 and measuring (1014) a temperature of the second power amplifier 210-2. The temperature difference between the first and second power amplifiers is determined based on the measured temperatures of the first and second power amplifiers. Alternatively, in some embodiments, the temperature difference of the first and second power amplifiers are measured directly by a temperature differential device without measuring a temperature of each individual power amplifier 210.

In some embodiments, the method 1000 further includes comparing (1020) the temperature difference to a predefined temperature difference tolerance. Operation from at least one of the first power amplifier 210-1 and the second power amplifier 210-2 is adjusted (1030), in accordance with a determination that the temperature difference is greater than the predefined temperature difference tolerance.

When the temperature difference is greater than a predefined temperature difference tolerance, one or both of the following operations is implemented: decreasing a temperature of the first power amplifier 210-1 and increasing a temperature of the second power amplifier 210-2 such that the temperature difference between the first and second power amplifiers 210-1 and 201-2 is reduced. In some situations, the temperature difference is minimized. More specifically, in some embodiments, the temperature of the first power amplifier 210-1 is decreased by one or more of: increasing an input power delivered to the first power amplifier 210-1, increasing a bias current supplied to the first power amplifier 210-1, increasing a bias voltage supplied to the first power amplifier 210-1, and decreasing a local environmental temperature of the first power amplifier 210-1 (e.g., via active cooling mechanism(s)). Alternatively or additionally, in some embodiments, the temperature of the second power amplifier 210-2 is increased by one or more of: decreasing an input power delivered to the second power amplifier 210-2, decreasing a bias current supplied to the second power amplifier 210-2, decreasing a bias voltage supplied to the second power amplifier 210-2, and increasing a local environmental temperature of the second power amplifier.

In some of the above operations, the temperature of the first power amplifier 210-1 is reduced by increasing a gain of the first power amplifier 210-1. In some of the above operations, the temperature of the second power amplifier 210-2 is increased by reducing a gain of the second power amplifier 210-2.

In some embodiments, in accordance with a determination that the temperature difference is greater than a temperature difference tolerance and that the first power amplifier 210-1 has a higher temperature than the second power amplifier 210-2, adjusting operation of at least one of the first power amplifier 210-1 and the second power amplifier 210-2 includes (1032) one or more of: (i) increasing an input power delivered to the first power amplifier 210-1, (ii) increasing a bias current $I_{bias}$ supplied to the first power amplifier 210-1, (iii) increasing a bias voltage $V_{bias}$ supplied to the first power amplifier 210-1, (iv) decreasing a local environmental temperature of the first power amplifier 210-1, (v) decreasing an input power delivered to the second power amplifier 210-2, (vi) decreasing a bias current bias supplied to the second power amplifier 210-2, (vii) decreasing a bias voltage $V_{bias}$ supplied to the second power amplifier 210-2, and (viii) increasing a local environmental temperature of the second power amplifier 210-2.

In some embodiments, the method 1000 is implemented by an electronic device 200 that includes a quadrature combiner 220, a first power amplifier 210-1, a second power amplifier 210-2, a temperature monitoring circuit 240, and a controller 270. The first and second power amplifiers 210-1 and 210-2 are coupled with the quadrature combiner 220 such that power outputted from each of the power amplifiers 210-1 and 210-2 is transmitted to and received by quadrature combiner 220. The temperature monitoring circuit 240 is coupled to each of the first and second power amplifiers 210-1 and 210-2 and is configured to determine a temperature between the first power amplifier 210-1 and the second power amplifier 210-2. The controller 270 is coupled to the temperature monitoring circuit 240 and is configured to control (e.g., adjust) operation of at least one of the first power amplifier 210-1 and the second power amplifier 210-2 such that the temperature difference between the first and second power amplifiers 210-1 and 210-2 is reduced and the combined power output from the quadrature combiner 220 is increased.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. An electronic device, comprising:
    a quadrature combiner;
    a first power amplifier coupled to the quadrature combiner;
    a second power amplifier coupled to the quadrature combiner;
    a temperature monitoring circuit coupled to the first and second power amplifiers, the temperature monitoring circuit being configured to determine a temperature difference between the first and second power amplifiers; and
    a controller coupled to the temperature monitoring circuit, wherein the controller is configured to adjust operation of at least one of the first and second power amplifiers to reduce the temperature difference between the first and second power amplifiers.

2. The electronic device of claim 1, wherein the temperature monitoring circuit includes:
    a first temperature sensor coupled to the first power amplifier, the first temperature sensor being configured to measure a temperature of the first power amplifier;
    a second temperature sensor coupled to the second power amplifier, the second temperature sensor being configured to measure a temperature of the second power amplifier; and
    a comparison circuit coupled to the first and second temperature sensors and configured to determine the temperature difference between the first and second power amplifiers based on the measured temperatures of the first and second power amplifiers.

3. The electronic device of claim 1, wherein the temperature monitoring circuit includes a temperature differential device configured to determine the temperature difference between the first power amplifier and the second power amplifier.

4. The electronic device of claim 1, wherein in accordance with a determination that the temperature difference is greater than a predefined temperature difference tolerance, the controller is configured to perform at least one of:
    decreasing a temperature of the first power amplifier that is coupled to the quadrature combiner; and
    increasing a temperature of the second power amplifier that is coupled to the quadrature combiner.

5. The electronic device of claim 4, wherein the controller is configured to decrease the temperature of the first power amplifier that is coupled to the quadrature combiner by one or more of:
    increasing an input power delivered to the first power amplifier;

increasing a bias current supplied to the first power amplifier;

increasing a bias voltage supplied to the first power amplifier; and decreasing a local environmental temperature of the first power amplifier.

6. The electronic device of claim 4, wherein the controller is configured to increase the temperature of the second power amplifier that is coupled to the quadrature combiner by one or more of:

decreasing an input power delivered to the second power amplifier;

decreasing a bias current supplied to the second power amplifier;

decreasing a bias voltage supplied to the second power amplifier; and increasing a local environmental temperature of the second power amplifier.

7. The electronic device of claim 4, wherein the controller is configured to decrease the temperature of the first power amplifier by increasing a gain of the first power amplifier.

8. The electronic device of claim 4, wherein the controller is configured to increase the temperature of the second power amplifier by decreasing a gain of the second power amplifier.

9. The electronic device of claim 1, further comprising an antenna array, wherein the antenna array is coupled to the quadrature combiner and configured to transmit a radio frequency signal generated by the quadrature combiner.

10. The electronic device of claim 9, wherein the antenna array corresponds to a voltage standing wave ratio (VSWR) load, and the temperature difference between the first and second power amplifiers is associated with the VSWR load.

11. The electronic device of claim 1, wherein the controller is configured to adjust the power from the one of the first and second power amplifiers based on the determined temperature difference at a start of each radio frequency transmission or dynamically during each radio frequency transmission.

12. The electronic device of claim 1, wherein reduction of the temperature difference between the first and second power amplifiers results in an increase in power output from the quadrature combiner.

13. The electronic device of claim 1, wherein the controller is configured to minimize the temperature difference between the first and second power amplifiers.

14. The electronic device of claim 1, wherein the controller is configured to reduce the temperature difference between the first and second power amplifiers to below a predetermined temperature difference threshold.

15. A method of amplifying a signal, comprising:

determining a temperature difference between a first power amplifier and a second power amplifier, the first and second power amplifiers being coupled to a quadrature combiner; and adjusting operation of at least one of the first and second power amplifiers to reduce the temperature difference between the first and second power amplifiers.

16. The method of claim 15, further comprising:

measuring a temperature of the first power amplifier; and measuring a temperature of the second power amplifier;

wherein the temperature difference between the first power amplifier and the second power amplifier is determined based on the temperature of the first power amplifier and the temperature of the second power amplifier.

17. The method of claim 15, further comprising:

comparing the temperature difference to a predefined temperature difference tolerance;

wherein the power from one of the first power amplifier and the second power amplifier is adjusted, in accordance with a determination that the temperature difference is greater than the predefined temperature difference tolerance.

18. The method of claim 15, wherein adjusting the operation of one of the first and second power amplifiers includes one or more of:

increasing an input power delivered to the first power amplifier;

increasing a bias current supplied to the first power amplifier;

increasing a bias voltage supplied to the first power amplifier;

decreasing a local environmental temperature of the first power amplifier;

decreasing an input power delivered to the second power amplifier;

decreasing a bias current supplied to the second power amplifier;

decreasing a bias voltage supplied to the second power amplifier; and increasing a local environmental temperature of the second power amplifier.

19. A communication system, comprising:

an antenna;

an amplification circuit coupled to the antenna and configured to amplify one or more signals to be transmitted by the antenna, the amplification circuit comprising:

a quadrature combiner;

a first power amplifier coupled to the quadrature combiner;

a second power amplifier coupled to the quadrature combiner;

a temperature monitoring circuit coupled to the first and second power amplifiers, the temperature monitoring circuit being configured to determine a temperature difference between the first and second power amplifiers; and a controller coupled to the temperature monitoring circuit, wherein the controller is configured to adjust operation of at least one of the first and second power amplifiers to reduce the temperature difference between the first and second power amplifiers.

20. The communication system of claim 19, wherein the controller is configured to adjust operation of at least one of the first and second power amplifiers by one or more of:

increasing an input power delivered to the first power amplifier;

increasing a gain of the first power amplifier;

decreasing a local environmental temperature of the first power amplifier;

decreasing an input power delivered to the second power amplifier; and decreasing a gain of the second power amplifier; and increasing a local environmental temperature of the second power amplifier.

* * * * *